United States Patent
Kwon et al.

(10) Patent No.: US 10,158,137 B2
(45) Date of Patent: Dec. 18, 2018

(54) CONTROL METHOD AND SYSTEM OF FUEL CELL SYSTEM

(71) Applicants: Hyundai Motor Company, Seoul (KR); Kia Motors Corporation, Seoul (KR)

(72) Inventors: Sang Uk Kwon, Gyeonggi-do (KR); Nam Woo Lee, Gyeonggi-do (KR); Sung Gone Yoon, Gyeonggi-do (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 676 days.

(21) Appl. No.: 14/679,195

(22) Filed: Apr. 6, 2015

(65) Prior Publication Data
US 2016/0133959 A1   May 12, 2016

(30) Foreign Application Priority Data
Nov. 7, 2014   (KR) .......................... 10-2014-0154114

(51) Int. Cl.
| | |
|---|---|
| H01M 8/04 | (2016.01) |
| H01M 8/04858 | (2016.01) |
| H01M 8/04746 | (2016.01) |
| H01M 8/04537 | (2016.01) |
| G01R 31/36 | (2006.01) |
| H01M 8/04664 | (2016.01) |
| H02J 1/10 | (2006.01) |
| H02J 7/34 | (2006.01) |
| H02J 1/00 | (2006.01) |

(52) U.S. Cl.
CPC ...... H01M 8/0488 (2013.01); G01R 31/3606 (2013.01); H01M 8/04559 (2013.01); H01M 8/04679 (2013.01); H01M 8/04753 (2013.01); H01M 8/04888 (2013.01); H02J 1/102 (2013.01); H02J 7/34 (2013.01); H01M 2250/20 (2013.01); H02J 2001/004 (2013.01); *Y02T 90/32* (2013.01)

(58) Field of Classification Search
CPC ........... H01M 8/0488; H01M 8/04753; H01M 8/04559; H01M 8/04888; H01M 2250/20; H02J 7/0052
See application file for complete search history.

(56) References Cited

FOREIGN PATENT DOCUMENTS

| | | | | |
|---|---|---|---|---|
| JP | 2000-173636 | * | 6/2000 | .............. H01M 8/04 8/10 |
| JP | 2006-180638 A | | 7/2006 | |
| JP | 2011-175946 A | | 9/2011 | |
| JP | 2013-041783 | * | 2/2013 | .............. H01M 8/04 8/10 |
| KR | 10-2006-0108341 A | | 10/2006 | |
| KR | 10-2009-0062332 A | | 6/2009 | |

(Continued)

*Primary Examiner* — Osei K Amponsah
(74) *Attorney, Agent, or Firm* — Mintz Levin Cohn Ferris Glovsky and Popeo, P.C.; Peter F. Corless

(57) ABSTRACT

A control method and system of a fuel cell system are provided. The control method includes draining the voltage of a fuel cell stack by charging a high voltage battery. In addition, the method includes draining the voltage of the fuel cell stack by connecting a fuel cell load device to the fuel cell stack, which is performed when the voltage of the fuel cell stack decreased by the first draining process is less than a predetermined first reference voltage.

13 Claims, 12 Drawing Sheets

(56) References Cited

FOREIGN PATENT DOCUMENTS

| KR | 10-2010-0060478 A | 6/2010 |
| KR | 10-2011-0057715 A | 6/2011 |
| KR | 10-2011-0062136 A | 6/2011 |
| KR | 10-2014-0078948 A | 6/2014 |

* cited by examiner

CONTROL METHOD AND SYSTEM OF FUEL CELL SYSTEM

CROSS REFERENCE TO RELATED APPLICATION

The present application claims priority of Korean Patent Application Number 10-2014-0154114 fried on Nov. 7, 2014, the entire contents of which application are incorporated herein for all purposes by this reference.

BACKGROUND

1. Field of the Invention

The present invention relates generally to a control method and system of a fuel cell system and, more particularly, to a control method of a fuel cell system that prevents deterioration of a fuel cell stack and diagnoses a failure in a load for draining residual voltage of the fuel cell stack.

2. Description of the Related Art

A fuel cell system applicable to a hydrogen fuel cell vehicle, a type of eco-friendly vehicle, is composed of a fuel cell stack to generate electric power from an electrochemical reaction of reactant gases; a hydrogen supplying system configured to supply hydrogen as fuel to a fuel cell stack; an air supplying system configured to supply gas including oxygen as an oxidant in electrochemical reactions; and a heat and water management system configured to manage water and maintain an optimal fuel cell stack temperature for driving by emitting heat, which is a by-product of the electrochemical reactions therein.

FIG. 1 is an exemplary schematic view illustrating an overall fuel cell system. As shown in FIG. 1, the fuel cell system 100 may include a fuel cell stack 10, a fuel cell load device 20, an air blower 30, a humidifier 40, air shutoff valves 35 and 45 in an inlet and outlet, a drain valve 42, a purge valve 44, a water trap 50, a hydrogen recirculation device 55, a hydrogen supply valve 57, a radiator 60, and a thermostat 65. The air shutoff valves 35 and 45 in the inlet and outlet may prevent inflow of an air to the fuel cell stack after a fuel cell vehicle shuts down. The drain valve 42 is disposed in a hydrogen exhaust line to remove generated water at an anode, and the purge valve 44 adjusts hydrogen concentrations at the anode and exhausts hydrogen to an air outlet to dilute the air.

The fuel cell load device 20 that lowers the voltage of the fuel cell stack 10 to drain the voltage is connected to the fuel cell stack 10 while the fuel cell vehicle is shutting down and after the fuel cell vehicle shuts down, to remove oxygen inside the fuel cell stack 10. The oxygen flowing into the fuel cell stack 10 is removed with residual hydrogen of the anode as the fuel cell load device 20 consumes current. However, insufficient hydrogen may preclude complete consumption of the oxygen, and thus a Wakeup technique is used to periodically supply hydrogen to the anode.

In other words, unlike an internal combustion vehicle, the fuel cell system 100 requires a post-processing procedure that lowers the voltage of the fuel cell stack 10 by removing residual air inside the fuel cell stack 10 after the fuel cell vehicle shuts down. The post-processing procedure prevents deterioration of the fuel cell stack 10 to avoid the danger of exposure to a high voltage. When voltage is formed as oxygen exists at the anode, carbon corrosion may occur at a cathode. Accordingly, it is necessary to remove the oxygen inside the fuel cell stack 10 and to prevent the additional inflow of oxygen. When additional oxygen flows into the fuel cell stack, draining oxygen removal is necessary. Consequently, when a vehicle shuts down, the system stops the supply of oxygen, intentionally consumes the residual oxygen for load current using the fuel cell load device 20, and decreases the voltage.

SUMMARY

It is an object of the present invention to provide a control method and system of a fuel cell system, which may decrease voltage of the fuel cell stack using a battery and a fuel cell load device, and may diagnose a breakdown of the fuel cell load device.

A control method of a fuel cell system according to an exemplary embodiment of the present invention may include: draining the voltage of a fuel cell stack by charging a high voltage battery; and draining the voltage of the fuel cell stack by connecting a fuel cell load device to the fuel cell stack when the voltage of the fuel cell stack is less than a predetermined first reference voltage (V1) as the voltage is being drained.

When the high voltage battery may not be charged, when a fuel cell vehicle crash is detected, or when a time duration for a voltage of a fuel cell stack to reach a predetermined first reference voltage is greater than a predetermined first reference time period, charging of the high voltage battery may be stopped and the second draining may be performed. The high voltage battery may not be charged under particular circumstances including when the high voltage battery breaks down, a power converter connected to the high voltage battery breaks down, a state of charge (SOC) of the high voltage battery is greater than a predetermined SOC, or a power source for the charging of the high voltage battery is insufficient. Since the fuel cell load device is connected to the fuel cell stack, when a voltage of the fuel cell stack is decreased to be less than a predetermined second reference voltage (V2), the second draining process may be terminated.

The control method may further include, adjusting a voltage of a main bus terminal disposed between the fuel cell stack and an inverter to an acceptable minimum voltage (V3) to prevent output power of the fuel cell stack from being provided to loads excluding the fuel cell load device until a voltage of the fuel cell stack reaches a predetermined second reference voltage (V2) according to the connection to the fuel cell load device. The adjustment of the voltage of the main bus terminal to the acceptable minimum voltage (V3) may maintain the voltage of the main bus terminal to be an initial value, and when the voltage of the fuel cell stack reaches the predetermined second reference voltage (V2), the voltage of the main bus terminal may be decreased to the acceptable minimum voltage (V3).

The adjustment of the voltage of the main bus terminal to the acceptable minimum voltage (V3) may maintain the voltage of the main bus terminal to be greater than a voltage of a fuel cell stack. In addition, the adjustment of the voltage of the main bus terminal to the acceptable minimum voltage (V3) may include disconnecting the fuel cell stack from the main bus terminal by turning off a main relay before connecting to the fuel cell load device. The acceptable minimum voltage (V3) may be less than the first reference voltage, and greater than a minimum voltage for operating a power converter connected to the high voltage battery or high voltage components connected to the main bus terminal.

Prior to the first draining process, the control method may further include stopping the supplying of air to the fuel cell stack after increasing the voltage of the fuel cell stack to be greater than the first reference voltage by supplying air to the fuel cell stack. Prior to the second draining process, the control method may further include disconnecting the fuel cell stack from a main bus terminal disposed between the fuel cell stack and an inverter, by turning off a main relay.

A control method of a fuel cell system according to another exemplary embodiment of the present invention may include: connecting a fuel cell load device to a fuel cell stack; and diagnosing an operation of the connected fuel cell load device. Additionally, the diagnosing of the operation of the fuel cell load device may include diagnosing the operation of the fuel cell load device based on at least one among current output from the fuel cell stack, current flowing in the fuel cell load device, and a speed of decrease in voltage of the fuel cell stack.

The diagnosing of the operation of the fuel cell load device may further include diagnosing that the fuel cell load device breaks down when a difference between a set current value and a current value flowing in the fuel cell load device or a difference between the set current value and a value of the output current of the fuel cell stack is greater than predetermined tolerances, respectively, the set current value being calculated based on both the voltage of the fuel cell stack and a resistance value of the fuel cell load device. The tolerances may be predetermined respectively based on a resolution of a sensor, sensing the current value flowing in the fuel cell load device, and a resolution of a sensor configured to sense the output current value of the fuel cell stack.

The diagnosing of the operation of the fuel cell load device based on the speed of decrease in voltage of the fuel cell stack may include diagnosing the operation of the fuel cell load device based on both a time required for the voltage of the fuel cell stack to reach a specific voltage after the fuel cell load device is connected to the fuel cell stack and a reference time required for the voltage of the fuel cell stack to reach the specific voltage under a normal operation of the fuel cell load device. The reference time may vary based a vehicle speed, an amount of air inflow, a water content of the fuel cell stack, a crossover state inside the fuel cell stack, or the voltage of the fuel cell stack at the moment when the fuel cell load device is connected to the fuel cell stack.

The diagnosing of the operation of the fuel cell load device based on the speed of decrease in voltage of the fuel cell stack may include diagnosing the operation of the fuel cell load device based on both the voltage of the fuel cell stack when a specific time period has elapsed after the fuel cell load device is connected to the fuel cell stack and a reference voltage that the fuel cell stack reaches after the specific time period under a normal operation of the fuel cell load device. The reference voltage may vary based on a vehicle speed, an amount of air inflow, a water content of the fuel cell stack, a crossover state inside the fuel cell stack, or the voltage of the fuel cell stack when the fuel cell load device is connected to the fuel cell stack.

Additionally, the diagnosing of the operation of the fuel cell load device may be performed based on at least one among a current output from the fuel cell stack and a current flowing in the fuel cell load device when the voltage of the fuel cell stack is greater than a predetermined voltage. The diagnosing of the operation of the fuel cell load device may also be performed based on the speed of decrease in voltage of the fuel cell stack when the voltage of the fuel cell stack is less than a predetermined voltage.

The fuel cell load device may be connected to the fuel cell stack when the voltage of the fuel cell stack is less than a predetermined first reference voltage as the voltage of the fuel cell stack is being drained by charging a high voltage battery; and the diagnosing of the operation of the fuel cell load device may be terminated when the voltage of the fuel cell stack is decreased to be less than a predetermined second reference voltage. The predetermined voltage may be greater than the predetermined second reference voltage and less than the predetermined first reference voltage.

When the voltage of the fuel cell stack is greater than the predetermined voltage, when a difference between a set current value and a current value flowing in the fuel cell load device or a difference between the set current value and a value of output current of the fuel cell stack is greater than predetermined tolerances, respectively, the fuel cell load device may be determined to be broken down, the set current value being calculated based on the voltage of the fuel cell stack and a resistance value of the fuel cell load device. When the voltage of the fuel cell stack is less than the predetermined voltage, the operation of the fuel cell load device may be diagnosed based on both a time required for the voltage of the fuel cell stack to reach a specific voltage from starting time of the diagnosis and a reference time required for the voltage of the fuel cell stack to reach the specific voltage under a normal operation of the fuel cell load device.

The reference time may vary based on a vehicle speed, an amount of air inflow, a water content of the fuel cell stack, a crossover state inside the fuel cell stack, or the voltage of the fuel cell stack when the fuel cell load device is connected to the fuel cell stack. The predetermined voltage may be greater than the specific voltage. When the voltage of the fuel cell stack is less than the predetermined voltage, the operation of the fuel cell load device may be diagnosed based on both a voltage of the fuel cell stack when a specific time period has elapsed from the start time of the diagnosis and a reference target voltage when the specific time period has elapsed under a normal operation of the fuel cell load device.

The reference voltage may vary based on a vehicle speed, an amount of air inflow, a water content of the fuel cell stack, a crossover state inside the fuel cell stack, or the voltage of the fuel cell stack when the fuel cell load device is connected to the fuel cell stack. The predetermined voltage may be greater than the reference voltage. The control method may further include, when the diagnosing of the operation of the fuel cell load device is terminated, storing results based on the termination of the diagnosis to a memory.

According to an exemplary embodiment of the present invention, the control method of the fuel cell system may improve durability of the fuel cell system by draining residual oxygen of the fuel cell stack. Additionally, the method may decrease a danger of high voltage exposure by lowering the voltage of the fuel cell stack. The method may also maintain stability when restarting the vehicle, and may improve fuel efficiency of the vehicle.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION

Figure 1:
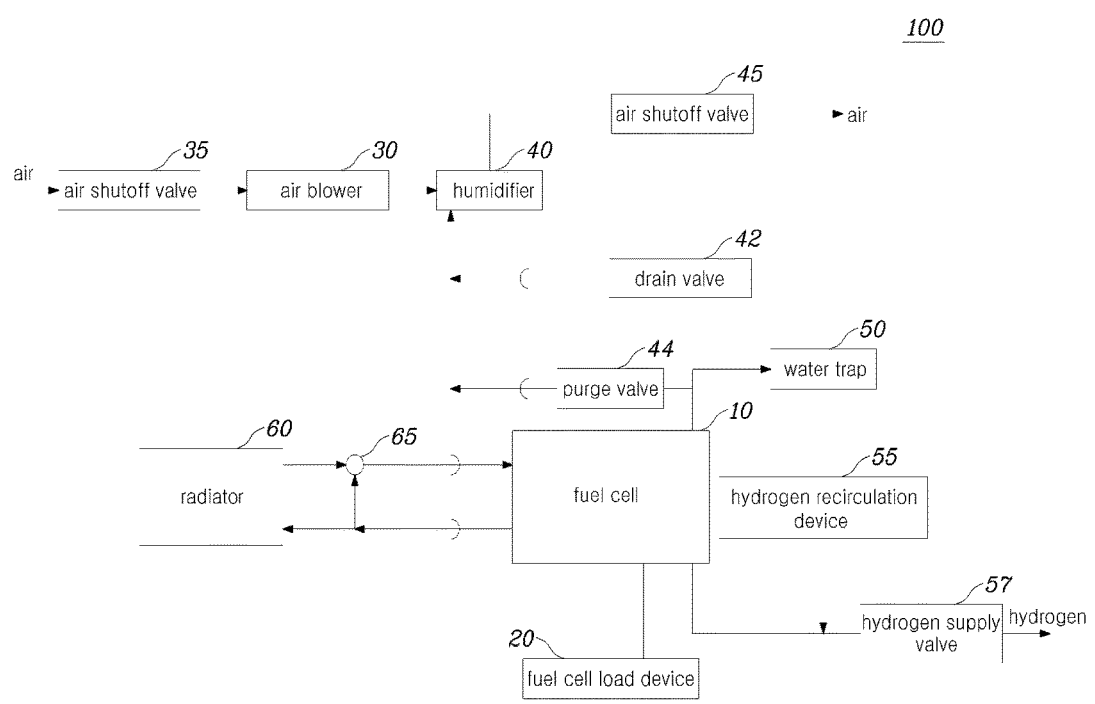
FIG. 1 is an exemplary schematic view illustrating an overall fuel cell system according to the related art.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

Although exemplary embodiment is described as using a plurality of units to perform the exemplary process, it is understood that the exemplary processes may also be performed by one or plurality of modules. Additionally, it is understood that the term controller/control unit refers to a hardware device that includes a memory and a processor. The memory is configured to store the modules and the processor is specifically configured to execute said modules to perform one or more processes which are described further below.

Furthermore, control logic of the present invention may be embodied as non-transitory computer readable media on a computer readable medium containing executable program instructions executed by a processor, controller/control unit or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed in network coupled computer systems so that the computer readable media is stored and executed in a distributed fashion, e.g., by a telematics server or a Controller Area Network (CAN).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/of" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Specific structural or functional descriptions in the exemplary embodiments of the present invention disclosed in the specification or application are only for description of the exemplary embodiments of the present invention, can be embodied in various forms and should not be construed as limited to the embodiments described in the specification or application.

Specific exemplary embodiments are illustrated in the drawings and described in detail in the specification or application because the exemplary embodiments of the present invention may have various forms and modifications. It should be understood, however, that there is no intent to limit the embodiments of the present invention to the specific embodiments, but the intention is to cover all modifications, equivalents, and alternatives included to the scope of the present invention.

Although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference now should be made to the drawings, in which the same reference numerals are used throughout the different drawings to designate the same or similar components.

Figure 2:
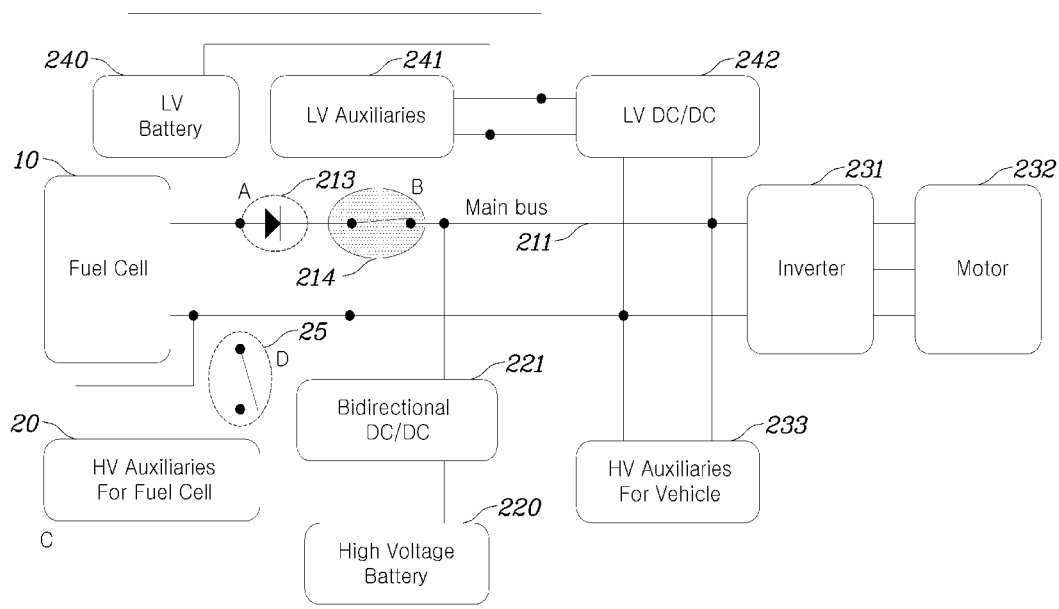
FIG. 2 is an exemplary block diagram of a power net of a fuel cell system according to an exemplary embodiment of the present invention.
Figure 3:
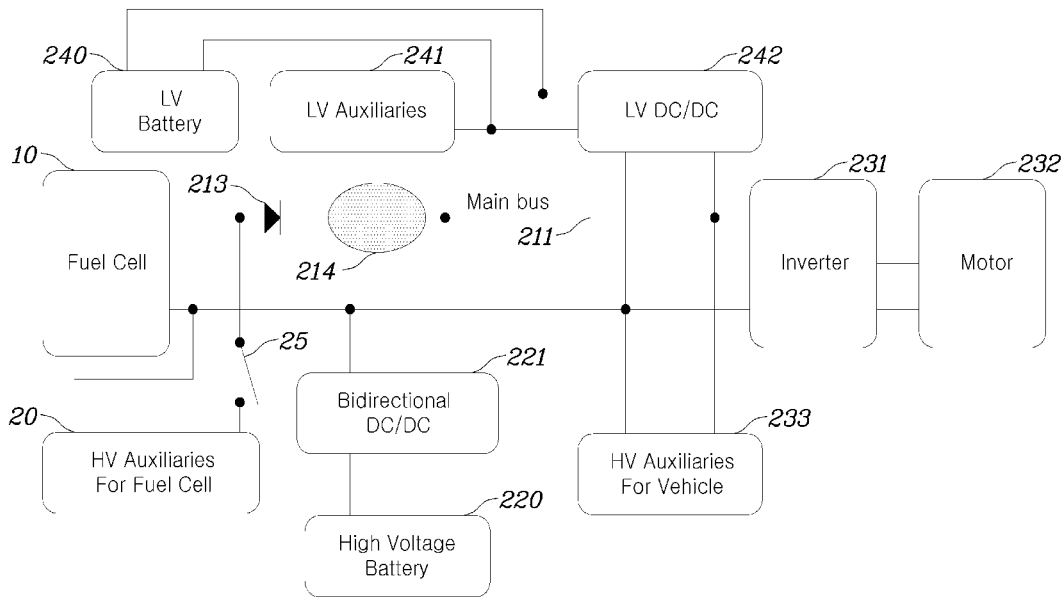
FIG. 3 is an exemplary block diagram of a power net of a fuel cell system according to another exemplary embodiment of the present invention.

FIG. 2 is an exemplary block diagram of a power net of a fuel cell system according to an exemplary embodiment of the present invention, and FIG. 3 is an exemplary block diagram of a power net of a fuel cell system according to another exemplary embodiment of the present invention. As shown in FIGS. 2 and 3, a fuel cell-battery hybrid system for a vehicle may include: a fuel cell 10 as a main power source and a high voltage battery (main battery) 220 as an auxiliary power source, which may be connected with each other in parallel via a main bus terminal 211; a bidirectional direct current-direct current (DC/DC) converter (e.g., BHDC: Bidirectional High Voltage DC/DC Converter) 221 connected to the high voltage battery 220 to adjust output power of the high voltage battery 220; an inverter 231 connected to the main bus terminal 211 on the output side of both the fuel cell 10 and the high voltage battery 220; a driving motor 232 connected to the inverter 231; a high voltage load 233 within the vehicle, exclusive of the inverter 231 and the driving motor 232; a low voltage battery (auxiliary battery) 240 and a low voltage load 241; a low voltage DC/DC converter (e.g., LDC: Low Voltage DC/DC Converter) 242, connected between the low voltage battery 240 and the main bus terminal 211, configured to convert a high voltage to a low voltage; and a fuel cell load device 20.

Herein, both the fuel cell 10 as a main power source and the high voltage battery 220 as an auxiliary power source may be connected in parallel via the main bus terminal 211 to intra-system loads such as the inverter 231, the driving motor 232, etc. The bidirectional DC/DC converter 221 connected to the high voltage battery may be connected to the main bus terminal 211 at the output side of the fuel cell 10, and therefore it may be possible to adjust output power of both the fuel cell 10 and the high voltage battery 220 by adjusting a voltage of the bidirectional DC/DC converter 221 (e.g., an output voltage to the main bus terminal).

The fuel cell 10 may include a diode 213 at an output terminal thereof to prevent back current and a relay 214 to selectively connect the fuel cell 10 to the main bus terminal 211. The relay 214 may be disposed in the power net shown in FIG. 2 but may not be disposed in the power net shown in FIG. 3. The relay 214 in FIG. 2 may be configured to connect the fuel cell 10 to the main bus during the idle stop/restart process of the fuel cell system and during the driving of the vehicle under a normal operation of the fuel cell 10 (e.g., operation without failure) and to disconnect the fuel cell 10 from the main bus upon the key-off of the vehicle (e.g., normal shutdown) or an emergency shutdown. The fuel cell load device 20 may be a load for draining a voltage of the fuel cell upon the start-up and shut-down of the fuel cell. The fuel cell 10 and the fuel cell load device 20 may be connected to each other via a fuel cell load relay 25.

The fuel cell system in FIG. 3 eliminate the relay 214, therefore it may be possible to reduce a cost for the relay and to reduce noise caused from the operation of the relay 214. However, to shut off an output power of the fuel cell, which is a role of the relay 214 in FIG. 2, the system should maintain a voltage of the bidirectional DC/DC converter 221 to be greater than an open circuit voltage of the fuel cell stack and limit load of both the high voltage load 233 and the low voltage load 241 within allowable output power of the high voltage battery, without the relay 214. Additionally, to reduce a time required to form high voltage when the fuel cell shuts down, the voltage of the fuel cell 10 is required to be drained. When the relay 214 is included in the system, it may be possible to prevent high voltage being formed in the bus terminal through shutoff of the relay 214.

Figure 4A:
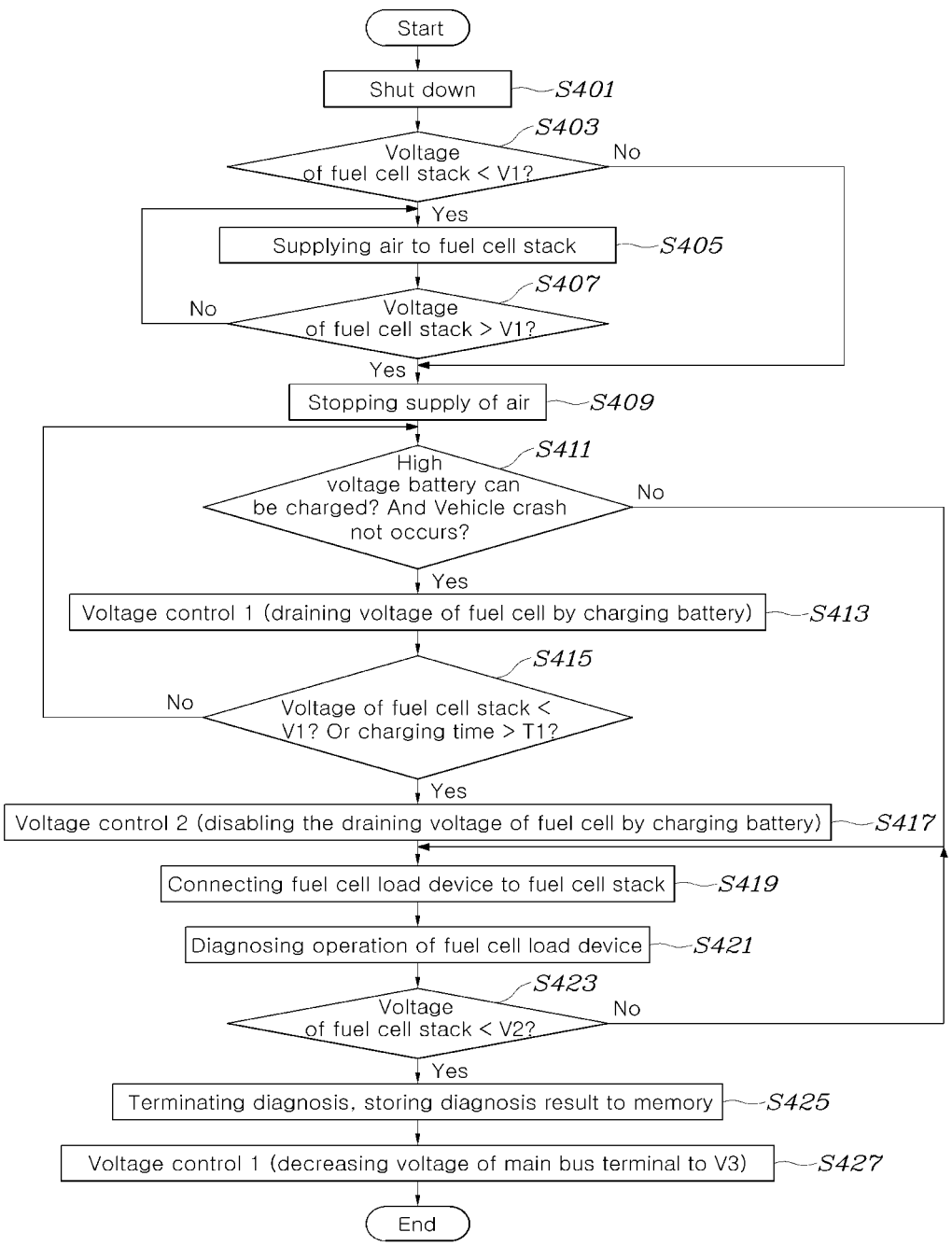
FIGS. 4A and 4B are exemplary flow diagrams illustrating a control method of a fuel cell system according to an exemplary embodiment of the present invention.
Figure 4B:
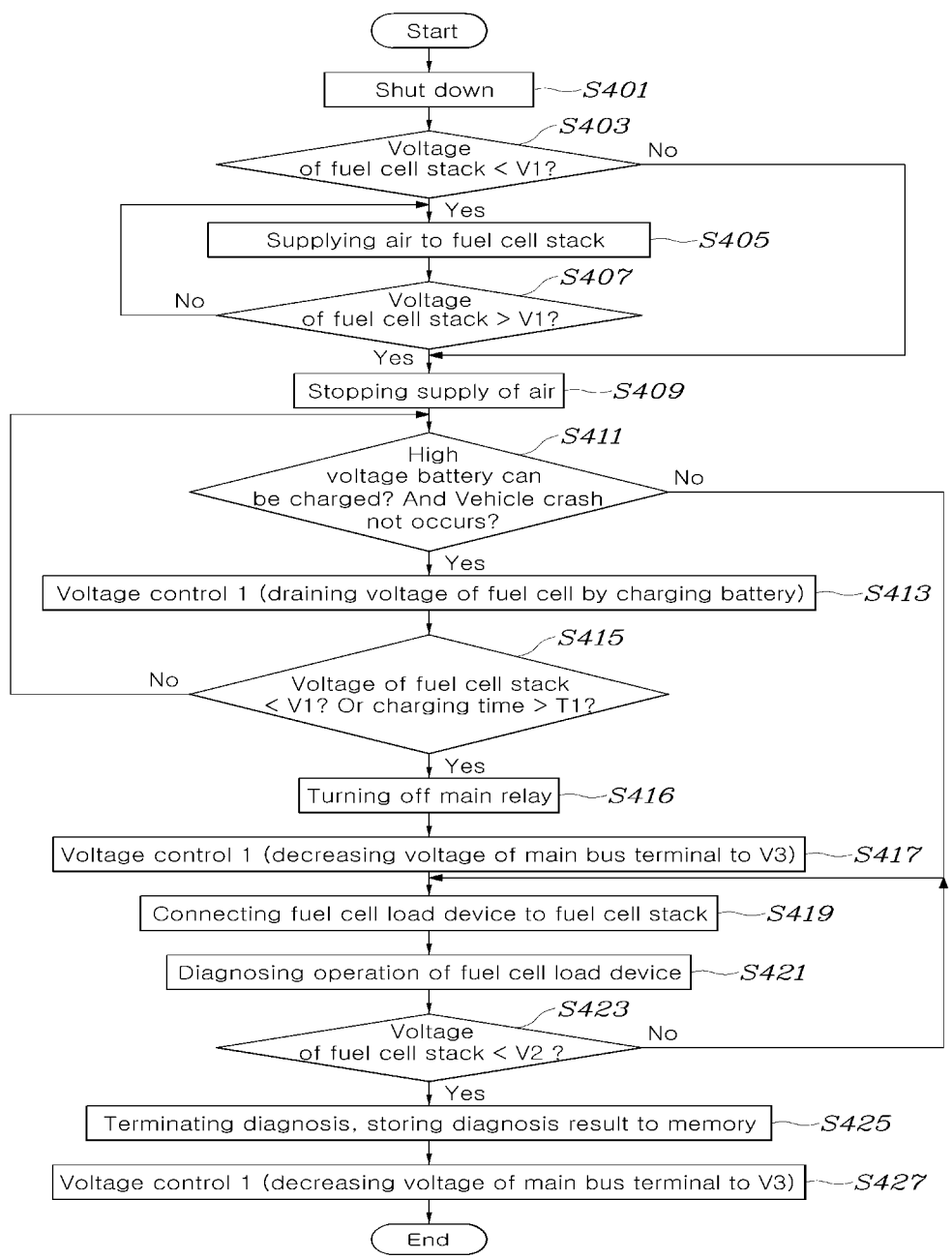

FIGS. 4A and 4B are exemplary flow diagrams illustrating a control method of a fuel cell system according to an exemplary embodiment of the present invention. FIG. 4A illustrates a control method in which the fuel cell system may include a main relay 214 configured to prevent an output power of the fuel cell from being provided to a main bus terminal, while FIG. 4B illustrates a control method in which the fuel cell system does not include the main relay 214. In particular, a fuel cell controller (FCU) may be configured to execute the respective steps in the flow diagram, or multiple controllers for each component within the fuel cell system, which communicate with the fuel cell controller may be configured to execute the process.

Referring to FIGS. 4A and 4B, when the fuel cell system 100 is shut down (S401), the controller may be configured to determine whether a voltage of the fuel cell stack 10 is less than a predetermined first reference voltage (V1) (S403). When the voltage of the fuel cell stack 10 is less than the predetermined first reference voltage (V1), air may be supplied to the fuel cell stack 10 (S405) and the voltage of the fuel cell stack 10 may be increased until the voltage is greater than the first reference voltage (V1) (S407), and then the supply of air to the fuel cell stack may be terminated (S409). When the voltage of the fuel cell stack is greater than the first reference voltage (V1), air may be prevented from being supplied to the fuel cell stack and the supply of air process may be terminated (S409).

In other words, stopping the supply of air may be performed regardless of the voltage of the fuel cell, but when the voltage of the fuel cell stack 10 is substantially low, the controller may be configured to supply air to the fuel cell stack to increase the voltage of the fuel cell stack to be greater than the first reference voltage (V1), and then stop the supply of air. When the fuel cell is shut down during the idle stop process, the voltage of the fuel cell stack 10 is already low, and thus it may be difficult to diagnose an operation of the fuel cell load device 20. To diagnose whether the fuel cell load device is operated, it may be necessary to operate the fuel cell load device in a state in which the voltage of the fuel cell stack 10 is as high as a particular degree. Accordingly, after air is supplied to the fuel cell stack to increase the voltage of the fuel cell stack to a particular degree, the supply of air may be stopped.

After stopping the supply of air, the controller may be configured to determine whether the high voltage battery 220 may be charged, or whether the fuel cell vehicle crash has not occurred (S411). Whether the high voltage battery may be charged 220 may be determined based on at least one condition selected from the group consisting of whether the high voltage battery 220 breaks down, whether the bidirectional DC/DC converter 221 connected to the high voltage battery 220 breaks down, whether the SOC (State of Charge) of the high voltage battery 220 is greater than a predetermined SOC, and whether a power source for the charging of the high voltage battery 220 is insufficient.

In response to determining the high voltage battery 220 may be charged, the voltage of the fuel cell stack may be consumed by the charging of the high voltage battery 220, and thus the voltage of the fuel cell stack 10 may be decreased (S413). As the voltage of the fuel cell stack 10 is decreased, the controller may be configured to determine whether the voltage of the fuel cell stack 10 is less than the predetermined first reference voltage (V1) or whether charging time of the high voltage battery 220 is greater than a predetermined time period (T1) (S415). When the voltage of the fuel cell stack 10 is less than the predetermined first reference voltage (V1) or when the charging time of the high voltage battery 220 is greater than the predetermined time period (T1), charging of the high voltage battery may be stopped (S417).

As shown in FIG. 4B, for the system that includes the main relay 214, when the voltage of the fuel cell stack 10 is less than the predetermined first reference voltage, or when the charging time of the high voltage battery is greater than the predetermined time period (T1), the fuel cell stack 10 may be disconnected from the main bus terminal 211 by turning off the main relay 214 (S416), and the voltage of the main bus terminal 211 may be decreased to reach a third reference voltage (V3) that may be predetermined to be about the same as the first reference voltage (V1) or to be less than the first reference voltage (V1) (S417). Stopping the charging of the high voltage battery 220 may be determined based on conditions that include the voltage of the main bus terminal 211, the maximum amount of the voltage drained from the fuel cell stack, which is attributable to the charging of the high voltage battery, and the like. The process of draining the voltage of the fuel cell stack 10 attributable to the charging of the high voltage battery 220 and the process of draining the voltage of the fuel cell stack 10 attributable to the operation of the fuel cell load device 20 may not be performed simultaneously.

More specifically, to prevent the output power of the fuel cell stack 10 to loads (e.g., high voltage battery, auxiliary machinery, etc.) exclusive of the fuel cell load device 20, the voltage of the main bus terminal 211 may be decreased to the predetermined third reference voltage. Further, the fuel cell stack 10 may be connected to the fuel cell load device 20 (S419). The operation of the fuel cell load device 20 may be diagnosed while the fuel cell load device 20 is being connected to the fuel cell stack 10 (S421). In other words, the controller may be configured to diagnose or determine whether the fuel cell load device 20 is being operated according to the purpose of the design thereof without failure.

When the voltage of the fuel cell stack is decreased to be less than a predetermined second reference voltage (V2) (S423), the diagnosis may be terminated and results of the diagnosis may be stored in a memory (S425). Then, the voltage of the main bus terminal 211 may be decreased to the predetermined third reference voltage (V3) by adjusting the voltage of the power converter, the bidirectional DC/DC converter 221 (S427). The voltage of the main bus terminal 211 may be decreased to the predetermined third reference voltage to facilitate determining whether to turn on a warning light, etc. according to the result of the diagnosis of the fuel cell load device 20, which may indicate whether the fuel cell load device breaks down, read from the memory at the next start-up of the vehicle after the shut-down.

The first reference voltage (V1) may be predetermined to be within the voltage operation range of the power converter 221. Additionally, the first reference voltage may be predetermined to be a substantially less value for the fuel efficiency of the fuel cell vehicle, while it may be predetermined to be a substantially greater value for the diagnosis of whether the fuel cell load device 20 breaks down. The third reference voltage (V3) may be a reference voltage for decreasing the voltage of the main bus terminal 211 to maintain stability of restarting, and may be predetermined to be a minimum voltage to drive the loads (e.g., auxiliary machinery, etc.) inside the fuel cell system 100 within the voltage operation range of the power converter 221. The first reference voltage (V1) may be about the same as the third reference voltage (V3) or greater than the third reference voltage (V3). Additionally, the third reference voltage (V3) may be greater than the minimum voltage to operate the power converter 221 connected to the high voltage battery 220 or high voltage components connected to the main bus terminal 211.

The fuel cell system 100 that does not include the main relay 214 may omit the process of decreasing the voltage of the main bus terminal 211 (S417) before stopping the charging of the high voltage battery 220, or if the system performs the step of S417, the system may be configured to prevent the power of the fuel cell stack 10 to be output to the loads including the high voltage battery 220, exclusive of the fuel cell load device 20.

Figure 5:
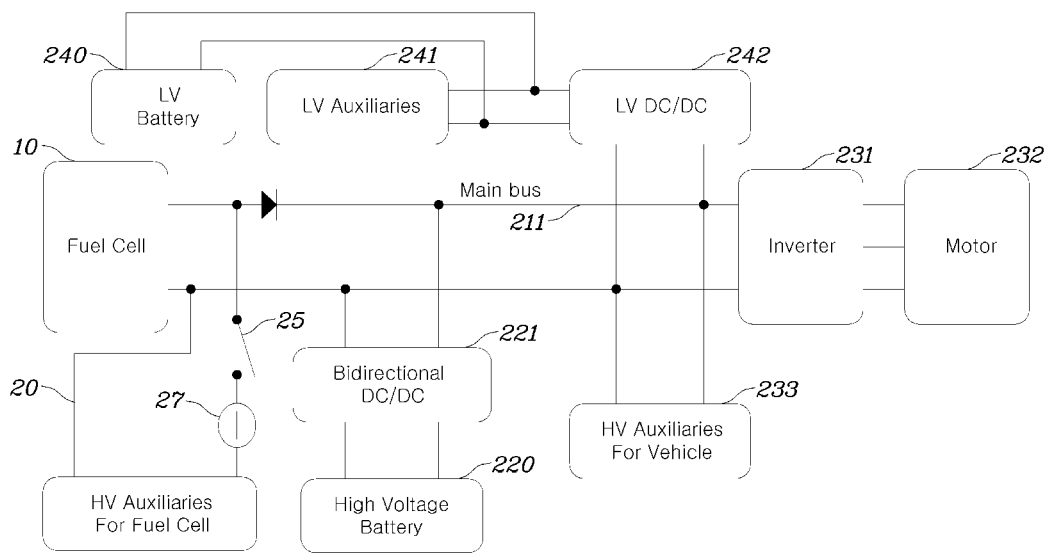
FIG. 5 is an exemplary block diagram of a power net of a fuel cell system according to an exemplary embodiment of the present invention.
Figure 6:
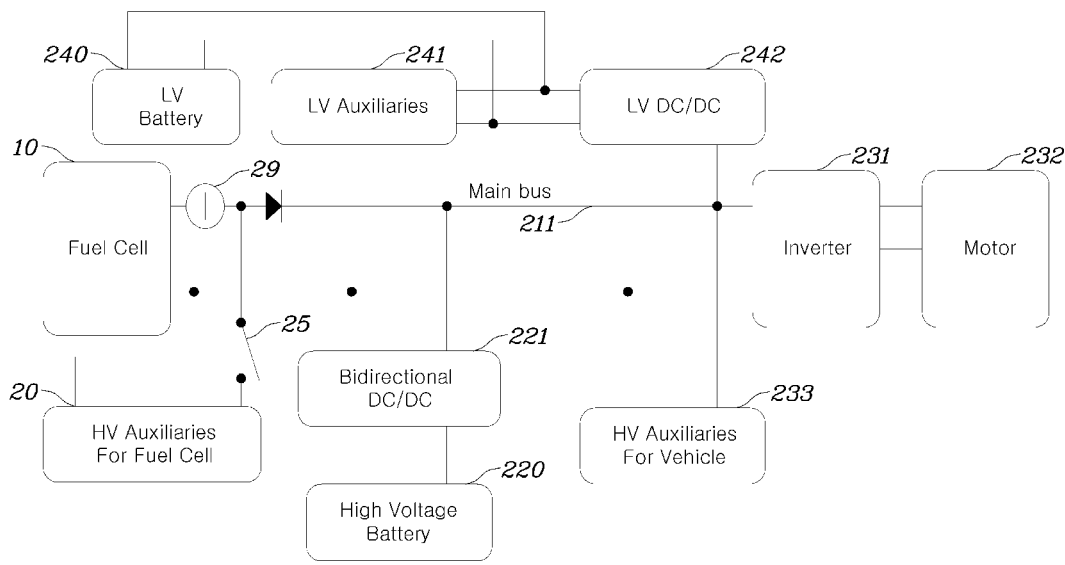
FIG. 6 is an exemplary block diagram of a power net of a fuel cell system according to another exemplary embodiment of the present invention.

FIG. 5 is an exemplary block diagram of a power net of a fuel cell system according to an exemplary embodiment of the present invention, and FIG. 6 is an exemplary block diagram of a power net of a fuel cell system according to another exemplary embodiment of the present invention. The description for the same components and configurations illustrated in FIG. 3 will be omitted. Referring to FIG. 5, the fuel cell system in FIG. 5 may further include a first current sensor 27 configured to sense a size of current flowing to the fuel cell load device 20. Current sensors adapted to the current range flowing to the fuel cell load device may be used as the first current sensor 27. The fuel cell system illustrated in FIG. 6 may include a second current sensor 29 configured to sense output current of the fuel cell stack 10, instead of the first current sensor 27 to sense the current flowing to the fuel cell load device 20. In particular, since the output current of the fuel cell stack 10 may have a greater range than the current flowing to the fuel cell load device 20, the second current sensor may be capable of high-resolution current sensing.

Figure 7A:
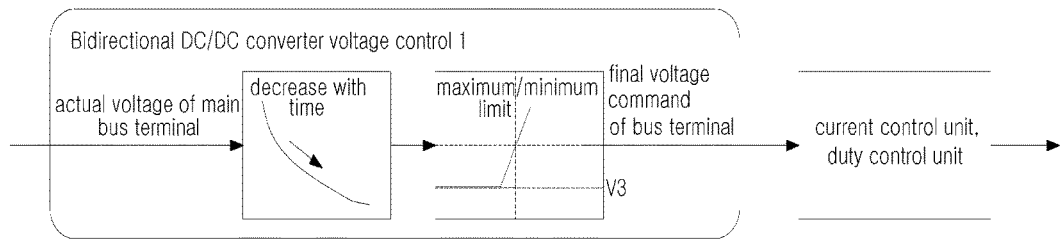
FIGS. 7A and 7B are exemplary views illustrating a process for draining the voltage of a fuel cell stack using a high voltage battery and a process to disable the process for draining the voltage of the fuel cell stack using the high voltage battery, respectively according to an exemplary embodiment of the present invention.
Figure 7B:
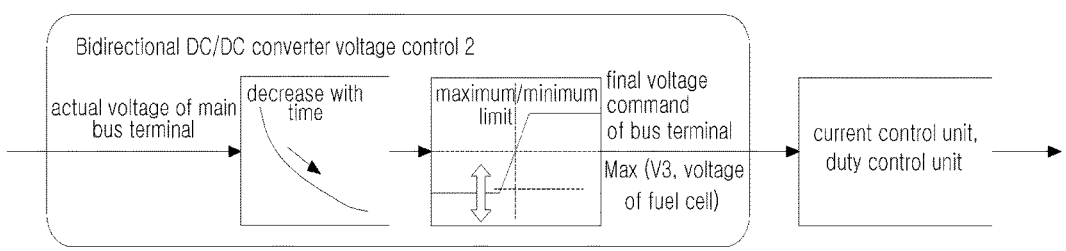

FIGS. 7A and 7B are exemplary views illustrating a process for draining the voltage of a fuel cell stack 10 using a high voltage battery 220 and a process to disable the process for draining the voltage of the fuel cell stack 10 using the high voltage battery 220, respectively. Draining of the voltage of the fuel cell stack 10 using the high voltage battery 220 may be performed until the voltage reaches the predetermined third reference voltage (V3). The voltage of the main bus terminal 211 may be decreased over time, but the acceptable minimum voltage may be limited to the third reference voltage (V3) (e.g., the voltage of the main bus terminal may be adjusted to an acceptable minimum voltage (V3)). The third reference voltage or the acceptable minimum voltage (V3) may be predetermined to be the lower value between the minimum operating voltage of the bidirectional DC/DC converter 221 and the minimum driving voltage of the high voltage load 233.

FIG. 7B shows when the voltage of the main bus terminal 211 maintained over time, or in which the minimum voltage limit of the main bus terminal 211 varies and the voltage of the main bus terminal is decreased based on the varying minimum voltage limit. The minimum voltage limit may be determined to the greater value between the voltage of the fuel cell stack 10 and the third reference voltage (V3) to maintain the voltage of the main bus terminal 211 greater than the output voltage of the fuel cell stack 10, whereby the output power of the fuel cell stack 10 may be prevented from being provided to the loads excluding the fuel cell load device 20.

Figure 8:
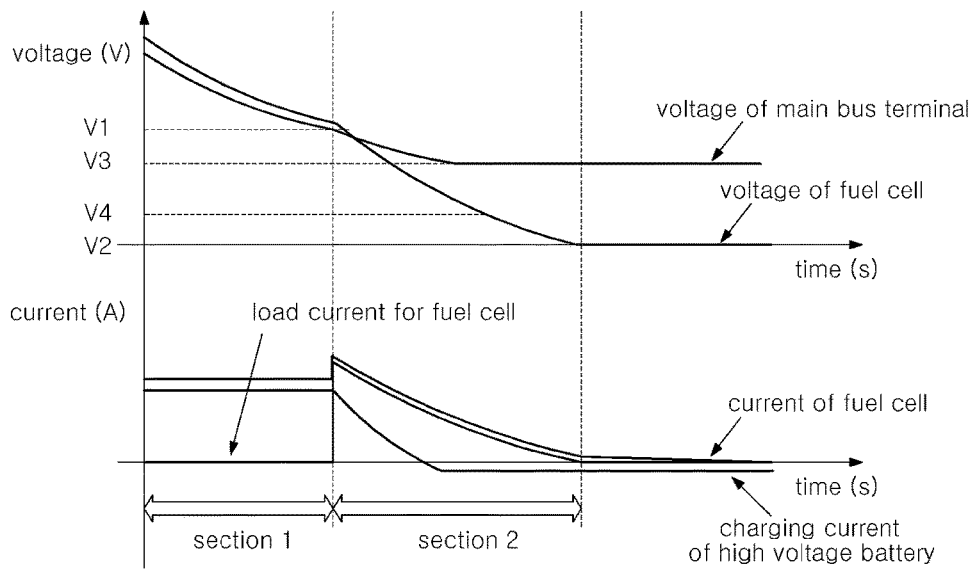
FIG. 8 is an exemplary graph illustrating variations in voltage and current with time when a fuel cell is shut down according to an exemplary embodiment of the present invention.

FIG. 8 is an exemplary graph illustrating variations in voltage and current with time when a fuel cell is shut down. Section 1 is a section in which the voltage of the fuel cell stack 10 is drained by the charging of the high voltage battery 220, and section 2 is a section in which the voltage of the fuel cell stack 10 is drained using the fuel cell load device 20. In the section 2, the operation of the fuel cell load device 20 may be diagnosed. Further, in the section 2, the main relay 214 may be turned off to prevent charging of the high voltage battery 220 by the fuel cell stack 10 or provide the output power of the fuel cell stack 10 from being provided to the auxiliary machinery. Additionally, decreasing the voltage of the main bus terminal 211 using the bidirectional DC/DC converter 221 may be disabled, and the voltage control 2 illustrated in FIG. 7B is performed.

Figure 9:
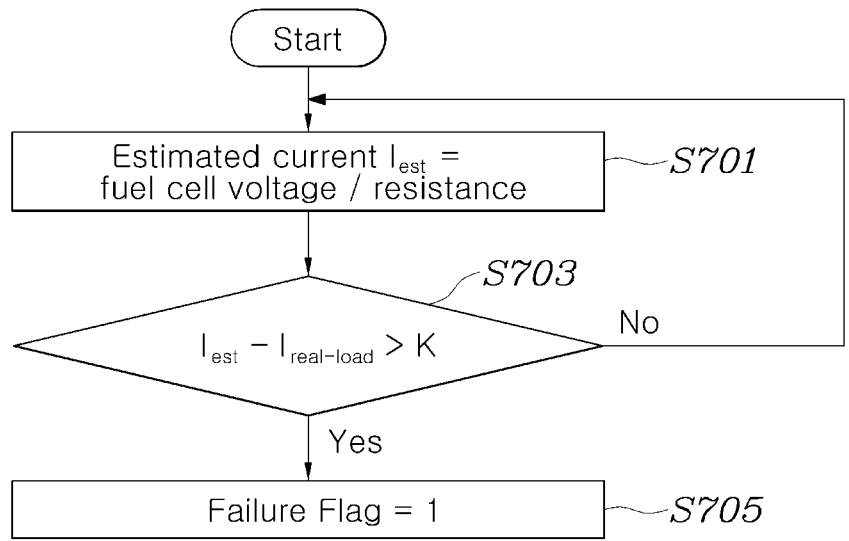
FIG. 9 is an exemplary flow diagram illustrating a method for diagnosing an operation of a fuel cell load device using a current value detected by a first current sensor shown in FIG. 5 according to an exemplary embodiment of the present invention.
Figure 10:
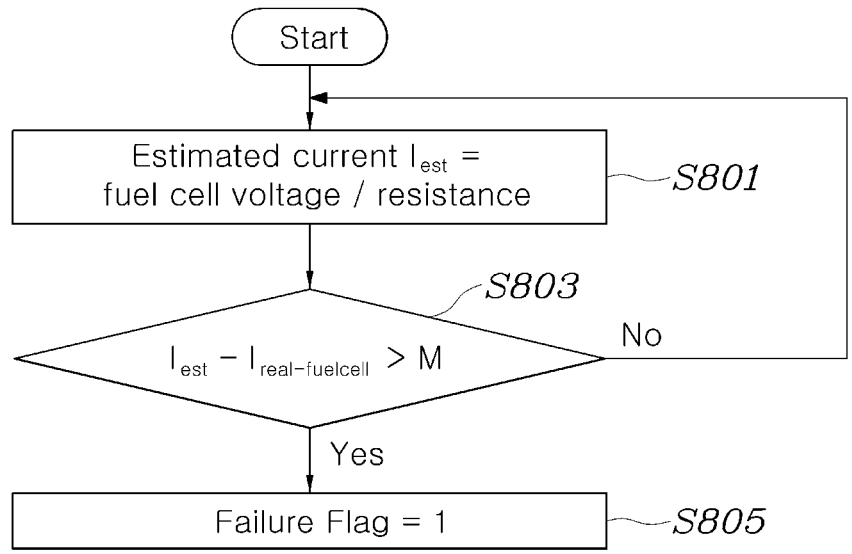
FIG. 10 is an exemplary flow diagram illustrating a method for diagnosing an operation of a fuel cell load device using a current value detected by a second current sensor shown in FIG. 6 according to an exemplary embodiment of the present invention.

FIG. 9 is an exemplar flow diagram illustrating a method for diagnosing the operation of the fuel cell load device 20 using a current value detected by the first current sensor 27 shown in FIG. 5. FIG. 10 is an exemplary flow diagram illustrating a method for diagnosing the operation of the fuel cell load device 20 using a current value detected by the second current sensor 29 shown in FIG. 6.

Referring to FIGS. 9 and 10, the control method of the fuel cell system according to an exemplary embodiment of the present invention may include diagnosing an operation of the fuel cell load device 20 connected to the fuel cell stack 10, and diagnosing the operation of the fuel cell load device 20 may include calculating an estimated current value ($I_{est}$) based on both the voltage of the fuel cell stack 10 and a resistance value of the fuel cell load device 20 (S701, S801). When the difference between the estimated current value ($I_{est}$) and a value of the current flowing in the fuel cell load device 20 ($I_{real-load}$) or the difference between the estimated current value ($I_{est}$) and a value of the output current of the fuel cell stack 10 ($I_{real-fuelcell}$) is greater than a predetermined tolerance (K, M) (S703, S803), the controller may be configured to determine that the fuel cell load device 20 breaks down (S705, S805). The predetermined tolerance (K, M) may be set differently based on the resolution of the first current sensor 27 of the fuel cell load device 20 and the resolution of the second current sensor 29 of the fuel cell stack 10.

Figure 11A:
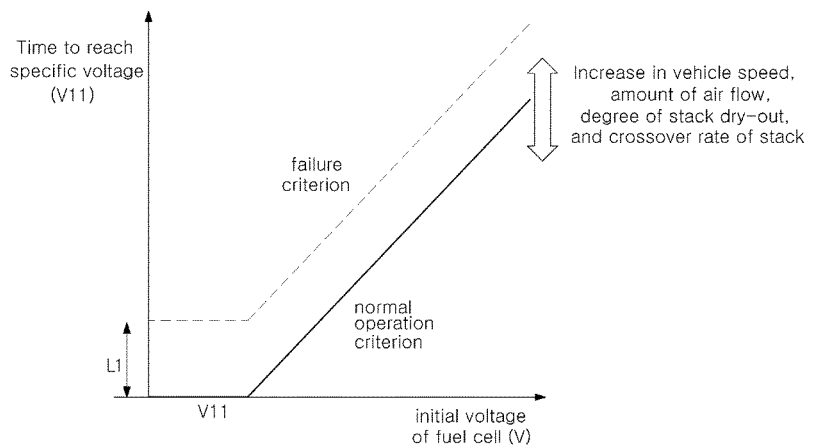
FIGS. 11A and 11B are according to an exemplary embodiment of the present invention graphs illustrating, when a fuel cell load device is under a normal operation and when the fuel cell load device breaks down, a time it will take to reach a specific voltage and a voltage after a specific time period according to variations in voltage of a fuel cell stack, respectively according to an exemplary embodiment of the present invention.
Figure 11B:
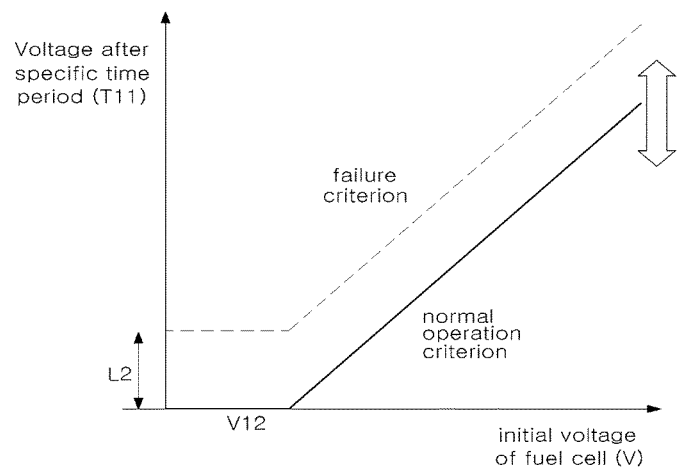

FIGS. 11A and 11B are exemplary graphs illustrating, when the fuel cell load device is under a normal operation (e.g., when no failure or break down occurs) and when the fuel cell load device breaks down, a time required to reach a specific voltage and a voltage after a specific time period based on variations in voltage of the fuel cell stack, respectively.

Referring to FIG. 11A, for diagnosing the operation of the fuel cell load device 20 based on the speed of the decrease in voltage of the fuel cell stack 10, the operation of the fuel cell load device 20 may be diagnosed based on both the time required for the voltage of the fuel cell stack 10 to reach a specific voltage (V11) after the fuel cell load device 20 is connected to the fuel cell stack 10 and a reference time (T_f) required for the voltage of the fuel cell stack 10 to reach the specific voltage (V11) under the normal operation of the fuel cell load device 20.

Referring to FIG. 11B, for diagnosing of the operation of fuel cell load device based on the speed of the decrease in voltage of the fuel cell stack, the operation of the fuel cell load device 20 may be diagnosed based on both the voltage of the fuel cell stack 10 when a specific time period (T11) has elapsed after the fuel cell load device 20 is connected to the fuel cell stack and a reference voltage (V_f) that the fuel cell stack 10 reaches when the specific time period (T11) has elapsed under the normal operation of the fuel cell load device 20.

In other words, after the fuel cell load device 20 is operated, the operation of the fuel cell load device may be diagnosed based on whether the time required for the voltage of the fuel cell stack to reach the specific voltage (V11) is greater than the reference time period and whether the voltage of the fuel cell stack after the specific time period (T11) is greater than the reference voltage. The time required to reach the specific voltage (V11) and the voltage that the fuel cell stack may reach after the specific time period (T11) may be variable based on the initial voltage of the fuel cell stack when the fuel cell load device 20 is operated (that is, the voltage of the fuel cell stack when starting to provide the output power of the fuel cell stack 10 to the fuel cell load device 20). Additionally, the failure criterion of the fuel cell load device 20 may be variable based on the initial voltage of the fuel cell stack when the fuel cell load device is operated. Both the time required to reach the specific voltage and the voltage that the fuel cell stack may reach may be increased as the speed of the vehicle increases. The times may also be increased when the air flow is detected and when the fuel cell stack 10 is in a dry-out state in which humidification of the fuel cell stack 10 is insufficient (e.g., internal resistance of the fuel cell increases). Further, the times may be decreased when hydrogen crossover occurs. Consequently, in consideration of the external environment and the degree of deterioration of the fuel cell stack (10), the reference voltage and the reference time period may be changed. In particular, when the speed of the vehicle, the amount of the air flow, the degree of the dry-out, and the hydrogen crossover rate are increased, the diagnosis of the operation of the fuel cell load device 20 may be disabled.

Referring to FIGS. 11A and 11B, it may be possible to diagnose whether the fuel cell load device is under the normal operation or it breaks down, according to the time required to reach the specific voltage or according to the voltage after the specific time period, which may be changed by the initial voltage of the fuel cell stack 10 (e.g., the voltage when the diagnosis is started). The criterion of determining the normal condition or failure condition may have offsets as L1, L2.

Figure 12:
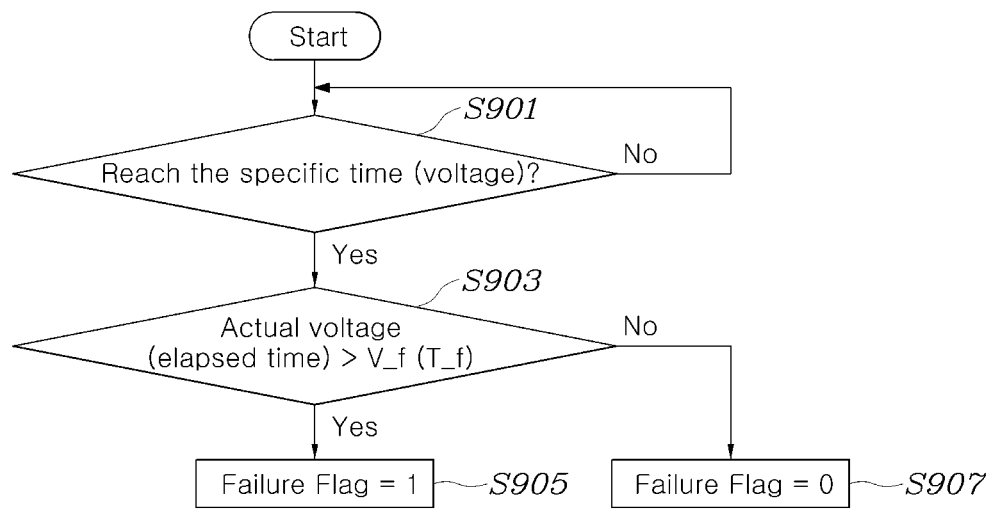
FIG. 12 is an exemplary flow diagram illustrating a method for diagnosing an operation of a fuel cell load device according to an exemplary embodiment of the present invention.
Figure 13:
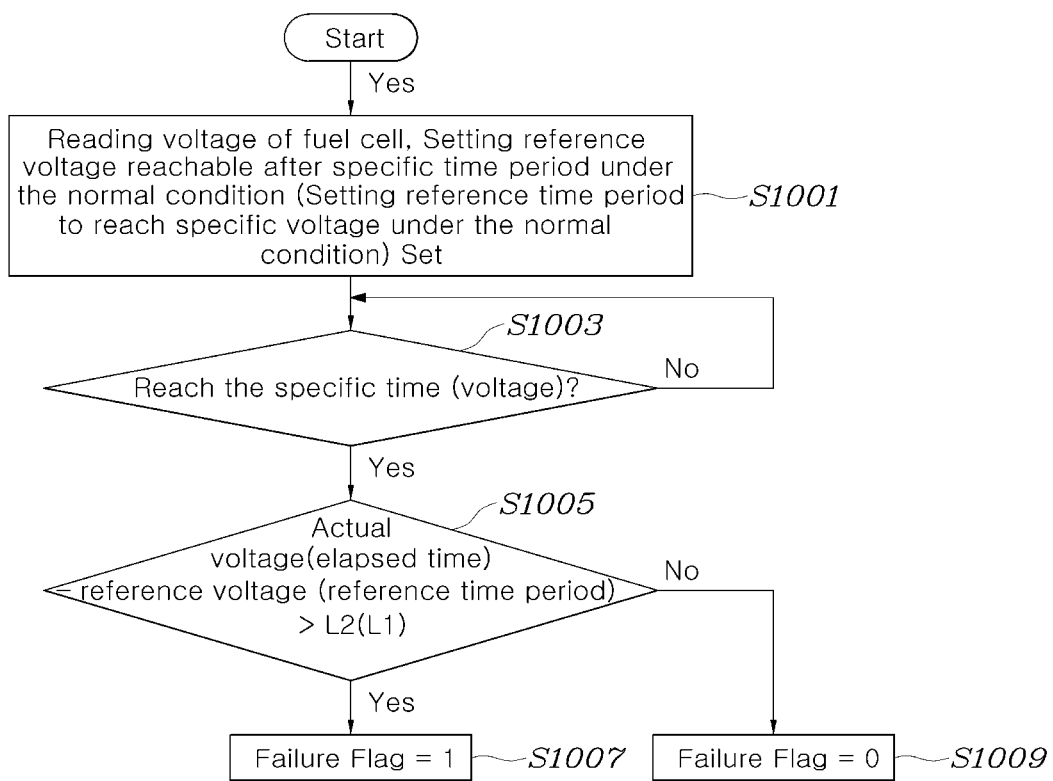
FIG. 13 is an exemplary flow diagram illustrating a method for diagnosing an operation of a fuel cell load device according to another exemplary embodiment of the present invention.

FIG. 12 is an exemplary flow diagram illustrating a method for diagnosing the operation of the fuel cell load device according to an exemplary embodiment of the present invention, and FIG. 13 is an exemplary flow diagram illustrating a method for diagnosing the operation of the fuel cell load device according to another exemplary embodiment of the present invention.

FIGS. 12 and 13 shows the method for diagnosing the failure in the fuel cell load device 20 in which the current sensors 27, 29 are not used in contrast with the method illustrated in FIGS. 9 and 10, which diagnoses the failure in the fuel cell load device 20 using the value detected by the current sensor. When the system does not include the current sensors 27, 29, the failure in the fuel cell load device 20 may be diagnosed using the speed of the decrease in voltage of the fuel cell stack 10.

In other words, after the fuel cell load device 20 is connected to the fuel cell stack 10, the controller may be configured to determine whether the time required for the voltage of the fuel cell stack to reach the specific voltage (V11) is greater than the reference time period, or whether the voltage of the fuel cell stack 10 is greater than the reference voltage when the specific time period has elapsed, and thus the controller may be configured to determine whether the fuel cell load device 20 breaks down.

Referring to FIG. 12, the diagnosing of the operation of the fuel cell load device 20 may include: determining whether the elapsed time after the connection to the fuel cell load device 20 is greater than a specific time limit (S901); determining whether the actual voltage of the fuel cell stack is greater than the reference voltage (V_f) when the elapsed time is greater than the specific time limit (S903); and diagnosing the operation of the fuel cell load device 20 (S905, S907). When the elapsed time is greater than the specific time limit and when the actual voltage of the fuel cell stack 10 is greater than the reference voltage (V_f) of the normal condition, the fuel cell load device 20 may be determined to be broken down, that is, not in the normal operating condition (S905), while when the actual voltage of the fuel cell stack 10 is less than the reference voltage (V_f), the fuel cell load device 20 may be determined to be operating normally (S907).

Furthermore, referring to FIG. 12, the diagnosing of the operation of the fuel cell load device 20 may include: after the connection to the fuel cell load device 20, determining whether the voltage of the fuel cell stack 10 reaches a specific voltage (V11, V12) (S901); determining whether the time required for the voltage of the fuel cell stack 10 to reach the specific voltage (V11, V12) is greater than the reference time period (T_f) (S903); and diagnosing the operation of the fuel cell load device 20 (S905, S907). When the voltage of the fuel cell stack 10 reaches the specific voltage (V11) and when the time required for the voltage of the fuel cell stack 10 to reach the specific voltage (V11) is greater than the reference time period (T_f) of the normal condition, the fuel cell load device 20 may be determined to be broken down, that is, not in the normal operating condition (S905), while when the time required for the voltage of the fuel cell stack 10 to reach the specific voltage (V11) is less than the reference time period (T_f), the fuel cell load device 20 may be determined to be operating normally (S907).

Referring to FIG. 13, the diagnosing of the operation of the fuel cell load device 20 may include: setting a reference voltage (V_f) of the fuel cell stack 10, which is the reachable voltage when a specific time period (T11) has elapsed after the connection to the fuel cell load device 20 under the normal operation of the fuel cell load device 20 (S1001); determining whether the specific time period has elapsed after the connection to the fuel cell load device 20 (S1003); and diagnosing the operation of the fuel cell load device (S1007, S1009) according to the difference between the voltage of the fuel cell stack 10 and the reference voltage (V_f) (S1005) when the specific time period (T11) has elapsed after the connection to the fuel cell load device.

In other words, first, the fuel cell load device 20 may be connected to the fuel cell stack 10, and the reference voltage may be previously set (S1001), which is, when the specific time period (T11) has elapsed after the connection, the voltage that the fuel cell stack may reach as the voltage is decreased by the normal operation of the fuel cell load device 20. Then, the controller may be configured to determine whether the specific time period (T11) has elapsed (S1003), and the voltage of the fuel cell stack 10, detected after the specific time period (T11), may be compared with the reference voltage (S1005). When the difference between the detected voltage and the reference voltage is greater than the offset (L2), the fuel cell load device may be determined to be broken down (S1007).

Additionally, referring to FIG. 13, the diagnosing of the operation of the fuel cell load device 20 may include: setting a reference time period (T_f), which is the time required for the voltage of the fuel cell stack 10 to reach a specific voltage (V11) under the normal operation of the fuel cell load device 20 (S1001); determining whether the voltage of the fuel cell load device 20 reaches the specific voltage (V11) (S1003); and diagnosing the operation of the fuel cell load device (S1007, S1009) according to the difference between the reference time period and the actual time required for the voltage of the fuel cell stack 10 to reach the specific voltage (V11) (S1005).

In other words, first, the fuel cell load device 20 may be connected to the fuel cell stack 10, and the reference time period (T_f) may be previously set (S1001), which is the time it will take to decrease the voltage of the fuel cell stack 10 to the specific target voltage after the connection under the normal operation of the fuel cell load device 20. Further, the controller may be configured to determine whether the voltage of the fuel cell stack is decreased to the specific voltage (S1003), and the time required to decrease the voltage of the fuel cell stack 10 to the specific voltage may be compared with the reference time period (S1005). When the difference between the reference time period and the time required to decrease the voltage of the fuel cell stack 10 to the specific voltage is greater than the predetermined tolerance (L1), the fuel cell load device may be determined to be broken down (S1007). When the difference between the reference time period and the time required to decrease the voltage of the fuel cell stack 10 to the specific voltage is less than the predetermined tolerance (L1), the fuel cell load device 20 may be diagnosed to be operating normally (S1009).

The reference target voltage after the specific time period and the reference time period required to reach the specific voltage may vary according to the voltage of the fuel cell stack 10 when the fuel cell load device 20 is connected to the fuel cell stack 10. In addition, the reference time period and the reference voltage may increase as the speed of the fuel cell vehicle increases. Additionally, when the air flow is detected and when the fuel cell stack 10 is in a dry-out state in which humidification of the fuel cell is insufficient, the reference time period and the reference voltage may increase. Further, as hydrogen crossover rate of the membrane of the fuel cell that comprises the fuel cell stack 10 is increased, the reference time period and the reference voltage may decrease.

Figure 14:
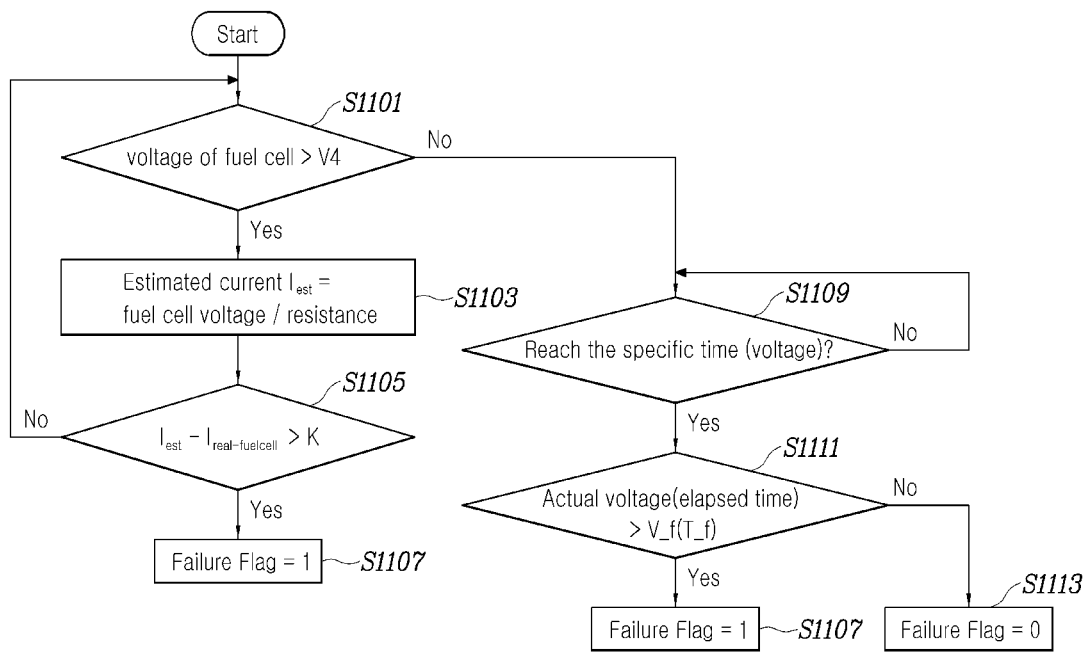
FIGS. 14 and 15 are according to an exemplary embodiment of the present invention flow diagrams illustrating a control method of a fuel cell system according to other exemplary embodiments of the present invention.
Figure 15:
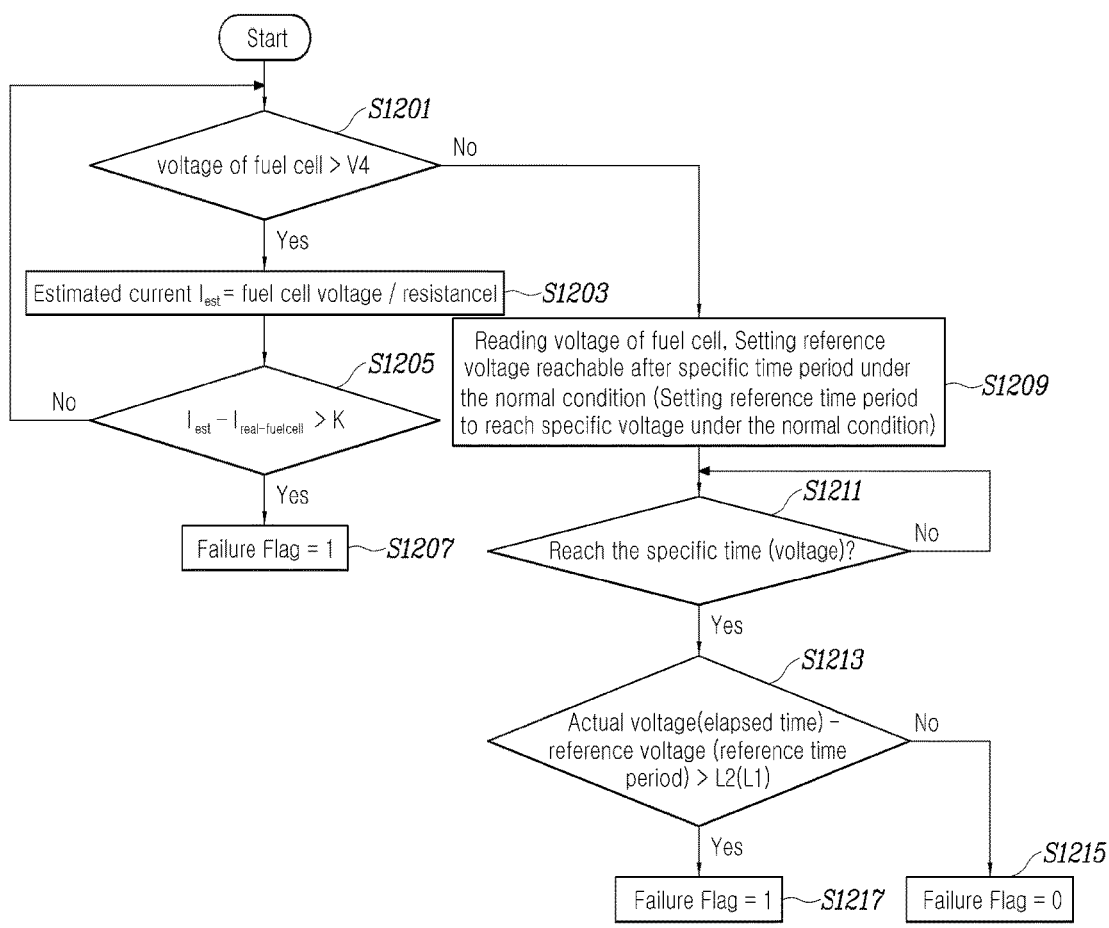

FIGS. 14 and 15 are exemplary flow diagrams illustrating a control method of a fuel cell system according to other exemplary embodiments of the present invention. The steps from S1103 to S1107 in FIG. 14 and the steps from S1203 to S1207 in FIG. 15 are the same as the steps from S801 to S805 in FIG. 10. The steps from S1109 to S1113 in FIG. 14 and the steps from S1209 to S1215 in FIG. 15 are the same as the steps from S901 to S907 in FIG. 12 and the steps from S1003 to S1009 in FIG. 13, respectively. Accordingly, descriptions about the formerly mentioned steps will be omitted.

The control method illustrated in FIGS. 14 and 15 changes the method for diagnosing the operation of the fuel cell load device 20 accordingly as the voltage of the fuel cell stack is greater than or less than a predetermined voltage (V4) when starting the diagnosis of the operation of the fuel cell load device 20. In other words, the voltage of the fuel cell stack 10 may be measured and compared with the predetermined voltage (V4) (S1101, S1201). When the voltage of the fuel cell stack 10 is greater than the predetermined voltage (V4), the estimated current value ($I_{est}$) may be calculated based on both the voltage of the fuel cell stack 10 and the resistance value of the fuel cell load device 20 (S1103, S1203). Then, when the difference between the estimated current value ($I_{est}$) and the output current value of the fuel cell stack 10 ($I_{real\text{-}fuelcell}$) is greater than a predetermined tolerance (K) (S1105, S1205), the fuel cell load device 20 may be diagnosed to a failure (S1107, S1207).

Furthermore, when the voltage of the fuel cell stack 10 is less than the predetermined voltage (V4), the operation of the fuel cell load device 20 may be diagnosed using the method illustrated in FIG. 12 or 13. In other words, when the voltage of the fuel cell stack 10 is less than the predetermined voltage (V4), the operation of the fuel cell load device 20 may be diagnosed based on both the time required for the voltage of the fuel cell stack to reach the specific voltage after the fuel cell load device 20 is connected to the fuel cell stack 10 (e.g., elapsed time) and the reference time period (T_f), which is the time required for the voltage of the fuel cell stack to reach the specific voltage under the normal operation of the fuel cell load device 20.

Additionally, when the voltage of the fuel cell stack 10 is less than the predetermined voltage (V4), the operation of the fuel cell load device 20 may be diagnosed based on both the voltage of the fuel cell stack when the specific time period has elapsed after the fuel cell load device 20 is connected to the fuel cell stack 10 and the reference voltage (V_f) that the fuel cell stack 10 reaches when the specific time period has elapsed under the normal operation of the fuel cell load device 20.

Diagnosing the operation of the fuel cell load device 20 using the current sensor may be more accurate than the diagnosing the operation of the fuel cell load device 20 based on the degree of the decrease in voltage with time. However, considering the range that the current sensor may be configured to measure, when the size of current flowing in the fuel cell load device 20 is substantial, the operation of the fuel cell load device 20 may be diagnosed using the current sensor, while when the current flowing in the fuel cell load device 20 is minimal enough to be undetectable by the current sensor, the operation of the fuel cell load device 20 may be diagnosed by the degree of decrease in voltage with time.

The predetermined voltage (V4) may be set to be greater than both the specific voltage (V11) and the reference voltage (V_f) that the fuel cell stack 10 reaches when the specific time period (T11) has elapsed under the normal operation of the fuel cell load device 20. Additionally, as shown in FIG. 8, the predetermined voltage (V4) may have the value between the first reference voltage (V1) and the second reference voltage (V2). Additionally, the predetermined voltage (V4) may be greater than L2, the tolerance (offset). As described above, since the method measuring the current may be more accurate than the method measuring the speed of the voltage decrease, the predetermined voltage (V4) may be the reference voltage that makes the method measuring the speed of the voltage decrease useful.

According to an exemplary embodiment of the present invention, the control method of the fuel cell system may improve durability of the fuel cell system by draining residual oxygen of the fuel cell stack. Further, the method has an effect of eliminating a danger of high voltage exposure by lowering the voltage of the fuel cell stack. Additionally, the method may maintain stability when restarting the vehicle, and may improve fuel efficiency of the vehicle.

Although the exemplary embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A control method of a fuel cell system, comprising:
   draining by a controller, a voltage of a fuel cell stack by charging a high voltage battery, when the fuel cell system is shut down and the voltage of the fuel cell stack is higher than a predetermined first reference voltage (V1);
   draining by the controller, the voltage of the fuel cell stack by connecting a fuel cell load device to the fuel cell stack, when the fuel cell system is shut down and the voltage of the fuel cell stack is less than the predetermined first reference voltage (V1) as the voltage is being drained,
   wherein the fuel cell load device is load for draining a voltage of the fuel cell upon the start-up or shut-down of the fuel cell; and
   adjusting, by the controller a voltage of a main bus terminal disposed between the fuel cell stack and an inverter to an acceptable minimum voltage (V3) to prevent output power of the fuel cell stack from being provided to loads excluding the fuel cell load device until the voltage of the fuel cell stack reaches a predetermined second reference voltage (V2) based on the connection of the fuel cell load device.

2. The control method of claim 1, wherein when the high voltage battery may not be charged, when a fuel cell vehicle crash is detected, or when a time required for a voltage of a fuel cell stack to reach a predetermined first reference voltage is greater than a predetermined first reference time period, charging of the high voltage battery is stopped and the second draining process is performed.

3. The control method of claim 2, wherein the high voltage battery may not be charged under particular circumstances that include when the high voltage battery breaks down, when a power converter connected to the high voltage battery breaks down, when a state of charge (SOC) of the high voltage battery is greater than a predetermined SOC, and when a power source for the charging of the high voltage battery is insufficient.

4. The control method of claim 1, wherein as the fuel cell load device is connected to the fuel cell stack, when the voltage of the fuel cell stack is decreased to be less than the predetermined second reference voltage (V2), the second draining process is terminated.

5. The control method of claim 1, wherein the adjusting of the voltage of the main bus terminal to the acceptable minimum voltage (V3) maintains the voltage of the main bus terminal to be an initial value, and when the voltage of the fuel cell stack reaches the predetermined second reference voltage (V2), decreases the voltage of the main bus terminal to the acceptable minimum voltage (V3).

6. The control method of claim 1, wherein the adjusting of the voltage of the main bus terminal to the acceptable minimum voltage (V3) maintains the voltage of the main bus terminal to be greater than a voltage of a fuel cell stack.

7. The control method of claim 1, wherein the adjusting of the voltage of the main bus terminal to the acceptable minimum voltage (V3) includes:
disconnecting, by the controller, the fuel cell stack from the main bus terminal by turning off a main relay before connecting to the fuel cell load device.

8. The control method of claim 1, wherein the acceptable minimum voltage (V3) is less than the first reference voltage, and is greater than a minimum voltage for operating a power converter connected to the high voltage battery or high voltage components connected to the main bus terminal.

9. The control method of claim 1, further comprising:
stopping, by the controller, the supply of air to the fuel cell stack after increasing the voltage of the fuel cell stack to be greater than the first reference voltage by supplying air to the fuel cell stack.

10. The control method of claim 1, further comprising:
disconnecting, by the controller, the fuel cell stack from a main bus terminal disposed between the fuel cell stack and an inverter, by turning off a main relay.

11. The control method of claim 7, wherein the acceptable minimum voltage (V3) is less than the first reference voltage, and is greater than a minimum voltage for operating a power converter connected to the high voltage battery or high voltage components connected to the main bus terminal.

12. The control method of claim 5, wherein the acceptable minimum voltage (V3) is less than the first reference voltage, and is greater than a minimum voltage for operating a power converter connected to the high voltage battery or high voltage components connected to the main bus terminal.

13. The control method of claim 6, wherein the acceptable minimum voltage (V3) is less than the first reference voltage, and is greater than a minimum voltage for operating a power converter connected to the high voltage battery or high voltage components connected to the main bus terminal.

* * * * *